United States Patent [19]

Inoue et al.

[11] Patent Number: 5,412,240
[45] Date of Patent: May 2, 1995

[54] SILICON-ON-INSULATOR CMOS DEVICE AND A LIQUID CRYSTAL DISPLAY WITH CONTROLLED BASE INSULATOR THICKNESS

[75] Inventors: Shunsuke Inoue; Toru Koizumi, both of Yokohama; Mamoru Miyawaki, Tokyo; Shigetoshi Sugawa, Atsugi, all of Japan

[73] Assignee: Canon Kabushiki Kaisha, Tokyo, Japan

[21] Appl. No.: 274,156

[22] Filed: Jul. 14, 1994

Related U.S. Application Data

[63] Continuation of Ser. No. 10,438, Jan. 28, 1993, abandoned.

[30] Foreign Application Priority Data

Jan. 31, 1992 [JP] Japan ................. 4-040496

[51] Int. Cl.⁶ ................. H01L 27/01; H01L 27/13
[52] U.S. Cl. ................. 257/347; 257/349; 257/351; 257/352; 359/59
[58] Field of Search ............. 257/347, 349, 351, 352; 359/54, 59

[56] References Cited

U.S. PATENT DOCUMENTS

| | | | |
|---|---|---|---|
| 4,409,724 | 10/1983 | Tasch et al. | 257/351 |
| 4,907,053 | 3/1990 | Ohmi | 257/347 |
| 5,060,035 | 10/1991 | Nishimura et al. | 257/351 |
| 5,225,356 | 7/1993 | Omura et al. | 257/347 |
| 5,233,207 | 8/1993 | Anzai | 257/351 |
| 5,241,211 | 8/1993 | Tashiro | 257/347 |

FOREIGN PATENT DOCUMENTS

| | | | |
|---|---|---|---|
| 225821 | 6/1987 | European Pat. Off. | 257/347 |
| 0469630 | 2/1992 | European Pat. Off. | |
| 61-94367 | 5/1986 | Japan | 257/347 |
| 63-142851 | 6/1988 | Japan | 257/351 |
| 2-25067 | 1/1990 | Japan | 257/347 |
| 3-105976 | 5/1991 | Japan | 257/349 |
| WO8902095 | 3/1989 | WIPO | 359/59 |

OTHER PUBLICATIONS

Pat. Abs. Jp. vol. 12, No. 402 (E–673) Oct. 25, 1988 & JP-A-63142851, Jun. 1988.
P. H. Woerlee et al., "A Half–Micron CMOS Technology Using Ultra–thin Silicon On Insulator", IEDM 90–583 pp. 25.1.1–25.1.4, (1990).
A. Kamgar et al., "Ultra–High Speed CMOS Circuits in Thin SIMOX Films", IEDM 89–829, pp. 34.4.1–34.4.4, (1989).
Kumamoto et al., "An SOI/CMOS Flash A/D Converter", IEICE vol. J71-C, No. 12, pp. 1651-8, (Dec. 1988).

*Primary Examiner*—Robert P. Limanek
*Assistant Examiner*—Minhloan Tran
*Attorney, Agent, or Firm*—Fitzpatrick, Cella, Harper & Scinto

[57] ABSTRACT

A semiconductor device has an NMOS transistor and a PMOS transistor formed on at least one monocrystal Si region formed in a thin-film Si layer formed on an insulation layer. The thickness $T_{BOX}$ of the insulation layer on which the NMOS and PMOS transistors are formed, the voltage $V_{SS}$ of a low-voltage power supply and the voltage $V_{DD}$ of a high-voltage power supply for the NMOS and PMOS transistors satisfy a relationship expressed by the following equation:

$$T_{BOX} > (V_{DD} - V_{SS} - K_2)/K_1$$

where $K_1 \equiv \epsilon_{BOX}(Q_{BN} + Q_{BP})$, $K_2 \equiv 2\Phi_{FN} + 2\Phi_{FP} - 1.03$, $\epsilon_{BOX}^{-1}$ is the dielectric constant of the base insulation layer, $Q_{BN}$ and $Q_{BP}$ are bulk charges when the widths of depletion layers of the NMOS and PMOS transistors are maximized, and $\Phi_{FN}$ and $\Phi_{FP}$ are pseudo Fermi potentials of the NMOS and PMOS transistors.

8 Claims, 9 Drawing Sheets

SILICON-ON-INSULATOR CMOS DEVICE AND A LIQUID CRYSTAL DISPLAY WITH CONTROLLED BASE INSULATOR THICKNESS

This application is a continuation of application Ser. No. 08/010,438 filed Jan. 28, 1993, now abandoned.

BACKGROUND OF THE INVENTION

1. Field of the Invention

This invention relates to a semiconductor device having a P-channel metal oxide silicon (PMOS) transistor and an N-channel metal oxide silicon (NMOS) transistor and to a liquid crystal display using the semiconductor device as a peripheral drive circuit and the PMOS transistor as a pixel electrode switching device.

2. Description of the Related Art

With the recent rapid progress of semiconductor technology, there has been a demand for smaller, high-speed and small-power-consumption semiconductor devices and apparatuses using such devices. The development of complementary MOS (CMOS) inverters using P-channel and N-channel enhancement type MOS field effect transistors (FET) as load and inverter devices among such apparatuses is being further promoted because the power consumption of this type of inverter is very small, although a complicated manufacturing process is required.

FIG. 1 (a) shows an example of a CMOS inverter in section. A transistor 16 is an NMOS transistor while a transistor 17 is a PMOS transistor. The transistors 16 and 17 are formed on a substrate while being insulated by a base insulation layer 2 and separated from each other by $SiO_2$ 3. The MOS transistor 16 is constituted of an N+ drain 5, a P-channel region 10, an N-type field limiting regions 12, 12', a gate insulation film 8, a gate electrode 9, a source electrode 14, and a drain electrode 15. The gate electrode is ordinarily formed of a polycrystalline Si, and the source and drain electrodes are formed of Al.

The PMOS transistor 17 is constituted of a P+ drain 6, a P+ source 7, N-channel region 11, a P-type field limiting regions 13, 13', a gate insulation film 8', a gate electrode 9', a source electrode 14', and a drain electrode 15'.

FIG. 1 (b) is an equivalent circuit diagram of the above-described CMOS inverter. As illustrated, the drain electrode 15 of the NMOS transistor 16 and the drain electrode 15' of the PMOS transistor 17 are connected to a common output electrode. An output voltage at this output electrode is represented by $V_{out}$. The source electrode 14 of the NMOS transistor 16 is connected to a low-voltage power supply, while the source electrode 14' of the PMOS transistor 17 is connected to a high-voltage power supply. The voltages of these power supplies are represented by $V_{SS}$ and $V_{DD}$. The substrate 1 forms gate electrodes of parasitic MOS transistors with respect to the NMOS transistor 16 and the PMOS transistor 17. That is, a parasitic PMOS transistor having a gate insulation layer corresponding to the base insulation layer 2, a channel region corresponding to the region 11, and a source and a drain corresponding to the drain 6 and the source 7 is formed, while a parasitic NMOS transistor having a gate insulation layer corresponding to the base insulation layer 2, a channel region corresponding to the region 10, and a source and a drain corresponding to the source 4 and the drain 5 is formed. $V_{back}$ in FIG. 1 (b) represents a voltage input to these parasitic CMOS transistors.

FIG. 9 shows input-output characteristics of a conventional CMOS inverter. In the case of conventional CMOS inverters, it is difficult to increase the absolute value of threshold voltages of parasitic MOS transistors. If the threshold values of the parasitic NMOS and PMOS transistors are $V_{thbn}$, and $V_{thbp}$, respectively, $V_{thbn} - V_{thbp}$ (the threshold value of the PMOS transistor being ordinarily negative) $> V_{DD} - V_{SS}$, that is, $V_{SS} < V_{SS} + V_{thbn} < V_{DD} + V_{thbp} < V_{DD}$. With respect to any value of $V_{back}$, the parasitic NMOS or PMOS transistor can operate. As shown in FIG. 9, in the case where $V_{in}$ becomes closer to $V_{DD}$ when $V_{back}$ is about zero, the parasitic PMOS transistor is operating and a leak current through the PMOS transistor inhibits the output from completely dropping to $V_{SS}$. On the other hand, in the case where $V_{in}$ becomes closer to $V_{SS}$ when $V_{back}$ is about 3 V, the parasitic NMOS transistor is operating and a leak current through the NMOS transistor inhibits the output from completely rising to $V_{DD}$.

As described above, a leak current flows by the operation of a parasitic CMOS transistor in the conventional CMOS inverter, resulting in failure to obtain an ideal input-output characteristic of the transistor.

For manufacture of a semiconductor device, monocrystal Si having a high carrier mobility is desirable in terms of high-speed driving performance. Conventionally, a SIMOX (separation by implanted oxygen) method has been used to form a monocrystal Si layer on an insulation layer. The thickness of the base insulation layer attained by this method is at most 5,000 Å. To increase the absolute value of the threshold value, it is necessary to increase the thickness of the base insulation layer according to a relationship between the base insulation layer thickness and the threshold value described later. However, it has been impossible to increase the base insulation layer thickness to a value greater than 5,000 Å for this manufacturing problem.

SUMMARY OF THE INVENTION

An object of the present invention is to provide a semiconductor device free from the above-described problem and a liquid crystal display using the semiconductor device.

Another object of the present invention is to provide a semiconductor device having an insulation layer thick enough to solve the above-described problem and a monocrystal silicon thin film formed on the insulation layer, and a liquid crystal display using the semiconductor device.

To achieve these objects, according to the present invention, there are provided a semiconductor device and a liquid crystal display using the semiconductor device in a peripheral drive circuit, the semiconductor device comprising an NMOS transistor and a PMOS transistor formed on at least one monocrystal Si region formed in a thin-film Si layer formed on an insulation layer, wherein the thickness $T_{BOX}$ of the insulation layer on which the NMOS and PMOS transistors are formed, the voltage $V_{SS}$ of a low-voltage power supply and the voltage $V_{DD}$ of a high-voltage power supply for the NMOS and PMOS transistors satisfy a relationship expressed by the following inequality:

$$T_{BOX} > (V_{DD} - V_{SS} - K_2)/K_1$$

where $K_1 \equiv \epsilon_{BOX}^{-1}(Q_{BN}+Q_{BP})$, $K_2 \equiv 2\Phi_{FN}+2\Phi_{FP}-1.03$, $\epsilon_{BOX}$ is a dielectric constant of the base insulation layer, $Q_{BN}$ and $Q_{BP}$ are bulk charges when the widths of depletion layers of the NMOS and PMOS transistors are maximized, and $\Phi_{FN}$ and $\Phi_{FP}$ are pseudo Fermi potentials of the NMOS and PMOS transistors.

In accordance with these objects, there is also provided a liquid crystal display with a peripheral drive circuit including a semiconductor device as described above wherein the PMOS switching transistor is formed on a first display portion of the insulation layer and the CMOS inverter is formed on a drive circuit portion of the insulation layer. A thickness of the display portion is less than a thickness of the drive circuit portion.

BRIEF DESCRIPTION OF THE DRAWINGS

FIG. 1 (b) is a equivalent circuit diagram of the semiconductor device shown in FIG. 1;

FIG. 6 (b) is a oxygen concentration profile of the process of the fourth embodiment;

DESCRIPTION OF THE PREFERRED EMBODIMENTS

Figure 1A:
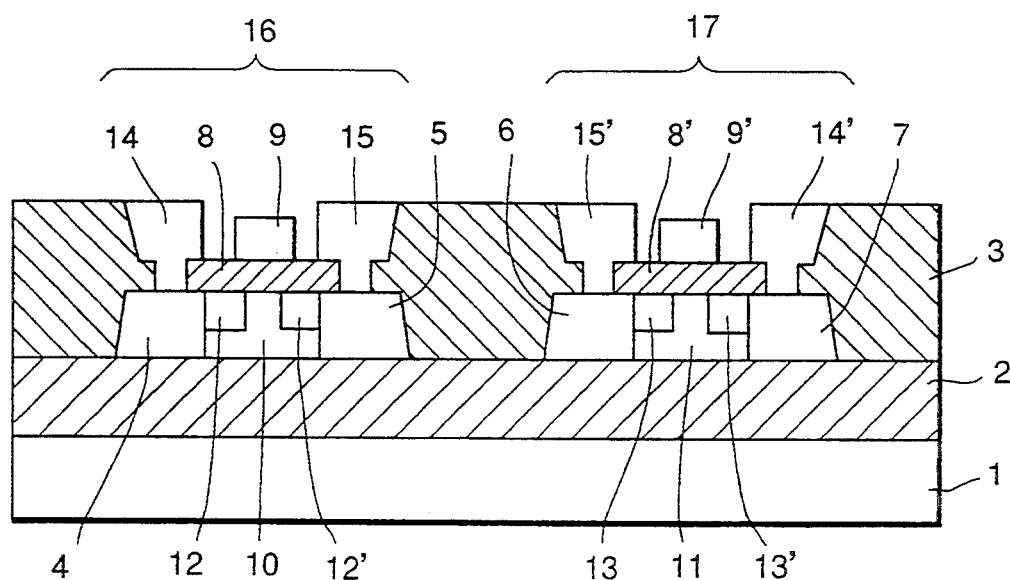
FIG. 1 (a) is a cross-sectional view of an example of a semiconductor device in accordance with the present invention.

The present invention will be described below in detail.

As described above, in accordance with the principle of the operation of a CMOS inverter, a condition necessary for the existence of a value of $V_{back}$ with which parasitic NMOS and PMOS transistors cannot operate is $V_{SS}+V_{thbn}<V_{DD}+V_{thbp}$.

$V_{thbn}$ and $V_{thbp}$ can be expressed as shown below.

$$V_{thbn} = +(Q_{BN}/C_{BOX}) + 2\phi_{FN} + V_{FBN}$$

$$Q_{BN} = \sqrt{2q\epsilon_{Si}N_N(2\phi_{FN})}$$

$$V_{FBN} = -qQ_{SS} - C_{BOX} - 0.88$$

$$V_{thbp} = -(Q_{BP}/C_{BOX}) - 2\phi_{FP} + V_{FBP}$$

$$Q_{BP} = \sqrt{2q\epsilon_{Si}N_P(2\phi_{FP})}$$

-continued
$$V_{FBP} = -qQ_{SS}/C_{BOX} + 0.15$$

$C_{BOX}$: the capacity per unit area of the base insulation layer (F/cm²)
q: elementary electric charge
$N_C$: a channel impurity concentration (cm⁻³) (subscript C representing either N or P)
$\Phi_{FN}$, $\Phi_{FP}$: psuedo Fermi potentials of the NMOS and PMOS transistors (V)
$Q_{SS}$: fixed oxide charge (cm⁻²)
$\epsilon_{Si}$: permittivity of silicon (F/cm)
$\Phi F_C=(kT/q)\ln(N_c/n_i)$(V) (subscript C represents N or P)
k: Boltzmann's constant (eV/K)
T: absolute temperature (K)
$n_i$: an intrinsic carrier density of Si
$V_{FBC}$: a flat band voltage (V)

Therefore,
$V_{thbn}-V_{thbp}=(Q_{BN}+QBP)/C_{BOX}+2\Phi_{FN}+2\Phi_{FP}-1.03$.

Each of the $Q_{BN}$, $Q_{BP}$, $\Phi_{FN}$, and $\Phi_{FP}$ in the above has only one value if the impurity concentrations $N_n$ and $N_p$ are determined.

Since $C_{BOX}=\epsilon_{BOX}/T_{BOX}$ $\epsilon_{BOX}$: a dielectric constant of the base insulation layer
$T_{BOX}$: the thickness of the base insulation layer, only $C_{BOX}$ in the above equation is changed with the thickness of the base insulation layer. Accordingly, $$V_{thbn}-V_{thbp}=K_1 T_{BOX}+K_2$$

where $K_1 \equiv \epsilon_{BOX}(Q_{BN}+Q_{BP})$ and $K_2 \equiv 2\Phi_{FN}+2\Phi_{FP}-1.03$.

$\therefore V_{DD}-V_{SS}<V_{thbn}-V_{thbp}=K_1 T_{BOX}+K_2$
$\therefore T_{BOX}>(V_{DD}-V_{SS}-K_2)/K_1$ If the base insulation layer has a thickness such as to satisfy this equation, the absolute value of the threshold values can be increased so that occurrence of a leak current is prevented.

According to the present invention, the method of manufacturing the base insulation layer is not particularly limited so long as the thickness in accordance with the above-described inequality is attained. However, the thickness of an insulation layer in the conventional SIMOX substrate cannot be indefinitely increased, as described above. In accordance with the present invention, a monocrystal Si region can be formed on a thick insulation layer, for example, by epitaxial growth on an SIMOX or porous Si substrative member changed in condition, or by laser-annealing a polycrystalline or amorphous Si thin film.

The present invention will be described with respect to examples thereof.

EMBODIMENT 1

A monocrystal Si thin film was formed by using a porous Si substrate member. A method of manufacturing this monocrystal Si thin film will be described below.

In the porous Si substrate member used, holes having a diameter of about 600 Å on an average are formed, which were observed through a transmission microscope. The density of the porous Si substrate is at most half that of monocrystal Si, but its monocrystal properties are maintained and a monocrystal Si layer can be formed on the porous layer by epitaxial growth. However, a rearrangement of internal holes takes place at 1,000° C. or higher, and the characteristics of enhanced etching are thereby impaired. For this reason, a low-temperature growing method, such as a molecular beam epitaxial growth method, a plasma chemical vapor deposition (CVD) method, a thermal CVD method, a photo-CVD method, a bias sputtering method, or a liquid crystal growth method, is preferred as a method for growing the Si layer.

A method in which P-type Si is made porous and a monocrystal layer is thereafter grown by epitaxial growth will be described below.

First, a Si monocrystal substrate member is prepared and is processed by an anodization method using a HF solution to form a porous layer therein. While the density of monocrystal Si is 2.33 g/cm$^3$, the density of the porous Si can be changed in the range of 0.6 to 1.1 g/cm$^3$ by changing the HF solution concentration in the range of 20 to 50% by weight. This porous layer can easily be formed into a P-type Si substrate member for a reason described below.

Porous Si was found in a process of studying electrolytic polishing of a semiconductor. In a dissolution reaction of Si in anodization, positive holes are required for anodization of Si in the HF solution. This reaction is expressed as follows.

$$Si + 2HF + (2-n)e^+ \rightarrow SiF_2 + 2H^+ + ne^-$$

$$SiF_2 + 2HF \rightarrow SiF_4 + H_2$$

$$SiF_4 + 2HF \rightarrow H_2SiF_6$$

or $$Si + 4HF + (4-\lambda)e^+ \rightarrow SiF_4 + 4H^+ + \lambda e^{31}$$

$$SiF_4 + 2HF \rightarrow H_2SiF_6$$

Symbols $e^+$ and $e^-$ represent holes and electrons, respectively. Each of n and $\lambda$ represents the number of holes, in the relevant equation, necessary for dissolving one Si atom. Porous Si is formed on condition that $n>2$ or $\lambda>4$.

From this fact, it can be said that P-type Si in which holes exist can easily be made porous.

On the other hand, it has been reported that high-density N-type Si can be made porous. Thus, a Si substrate member can be made porous irrespective of being P- or N-type.

Also, the density of the porous layer is a half or less of the original density, since many gaps are formed in the porous layer. Therefore the surface area is greatly increased relative to the volume. The chemical etching speed is thereby increased remarkably in comparison with the etching speed of the ordinary monocrystal layer.

Conditions for making monocrystal Si porous by anodization are shown below. A starting material of porous Si formed by anodization is not limited to monocrystal Si, and Si in other crystalline structures can be used.

Applied voltage: 2 (V)
Current density: 30 (mA. cm$^{-2}$)
anodization solution: HF:H$_2$O:C$_2$H$_5$OH = 1:1:1
Time: 2.4 (hours)
Thickness of porous Si: 300 ($\mu$m)
Porosity: 56%

Si is grown by epitaxial growth on porous Si formed in this manner, thereby forming a monocrystal Si thin film. The thickness of the monocrystal Si thin film is, preferably, 50 $\mu$m or less, more preferably, 20 $\mu$m or less.

A surface of the monocrystal Si thin film is then oxidized. A substrate member which is to finally form a main substrate is prepared and is attached to the oxide film in the monocrystal Si surface. Alternatively, a surface of monocrystal Si substrate member newly prepared is oxidized and is attached to the monocrystal Si layer on the porous Si substrate member. The reason for the provision of such an oxide film between the substrate member and the monocrystal Si layer is because an interface level generated from a base interface of a Si active layer with an oxide film can be smaller than, for example, an interface level from a base interface with a glass provided as a substrate member. It is possible to greatly improve characteristics of an electronic device by forming such an oxide film interface. Further, only a monocrystal Si thin film prepared by removing a porous Si substrate member by a selective etching process described later may be attached to a new substrate member. Two substrate members can be attached closely enough to prevent separation between them by the van der Waals force, if their surfaces are washed and thereafter brought into contact with each other at room temperature. However, the substrate members in this state are processed by a heat treatment in a nitrogen atmosphere at a temperature in the range of 200° to 900° C., preferably, 600° to 900° C.

An Si$_3$N$_4$ layer is formed as an etching prevention film by deposition over the entire surface of the two attached substrate members. Only the portion of the Si$_3$N$_4$ layer on the surface of the porous Si substrate member is then removed. Apiezon wax may be used instead of Si$_3$N$_4$. Thereafter, the porous Si substrate member is entirely removed by etching or other means. A semiconductor substrate having a thin monocrystal Si layer can be obtained in this manner.

A selective etching method for etching only the porous Si substrate member by non-electrolyte wet etching will be described below.

As an etching liquid having no etching effect with respect to crystalline Si but capable of selectively etching only porous Si, it is preferable to use hydrofluoric acid, buffered hydrofluoric acid of ammonium fluoride (NH$_4$F), hydrogen fluoride (HF) or the like, a liquid of a mixture of hydrofluoric acid or buffered hydrofluoric acid and hydrogen peroxide solution, a liquid of a mixture of hydrofluoric acid or buffered hydrofluoric acid and alcohol, or a liquid of a mixture of hydrofluoric acid or buffered hydrofluoric acid, hydrogen peroxide solution and alcohol. The substrate members attached to each other undergo etching by being wetted with such an etching liquid. The etching speed depends upon the concentration of hydrofluoric acid, buffered hydrofluoric acid and hydrogen peroxide in the solution and upon the temperature. By the addition of the hydrogen peroxide solution, the oxidation of Si is promoted and the reaction speed is increased in comparison with an etching liquid to which no hydrogen peroxide solution is added. Further, the reaction speed can be controlled by changing the proportion of the hydrogen peroxide solution. By the addition of alcohol, bubbles of a reaction product gas can be instantly removed from the etched surface without agitation, and the porous Si can be etched uniformly and efficiently.

The HF concentration in buffered hydrofluoric acid is set in the range of, preferably, 1 to 95%, more preferably, 1 to 85 %, and further preferably, 1 to 70% by weight of the etching liquid.

The NH$_4$F concentration in buffered hydrofluoric acid is set in the range of, preferably, 1 to 95%, more preferably, 5 to 90%, and further preferably, 5 to 80% by weight of the etching liquid.

The HF concentration is set in the range of, preferably, 1 to 95%, more preferably, 5 to 90%, and further preferably, 5 to 80% by weight of the etching liquid.

The H$_2$O$_2$ concentration is set in the range of, preferably, 1 to 95%, more preferably, 5 to 90%, and further preferably, 10 to 80% by weight of the etching liquid, and is set in a range such that the above-described effect of hydrogen peroxide solution can be attained.

The alcohol concentration is set in the range of, preferably, 80% or less, more preferably, 60% or less, and further preferably, 40% or less by weight of the etching liquid, and is set in a range such that the above-described effect of alcohol can be attained.

The temperature is set in the range of, preferably, 0° to 100° C., more preferably, 5° to 80° C., and further preferably, 5° to 60° C.

Alcohol used in accordance with the present invention comprises ethyl alcohol, isopropyl alcohol and the like, i.e., alcohols which entail no considerable problem in the manufacturing process in practice and which ensure the above-described alcohol addition effect.

In the semiconductor substrate obtained in this manner, a thin large-area layer of monocrystal Si equivalent to the ordinary Si wafer is formed flat and uniformly to cover the entire area on the substrate.

A monocrystal Si thin film, such as the one described in detail in the specification of European Patent Laid-Open Publication No.469630, can be specifically used as the above-described monocrystal Si thin film in accordance with the present invention.

In this embodiment of the invention, a SiO$_2$ film having a thickness of 10,000 Å was formed on a monocrystal Si substrate, and was attached to a monocrystal Si thin film to form a base insulation layer. A CMOS inverter such as that shown in FIG. 1 was manufactured by using this base insulation layer. The method of setting the above-mentioned film thickness will be described below.

Figure 3:
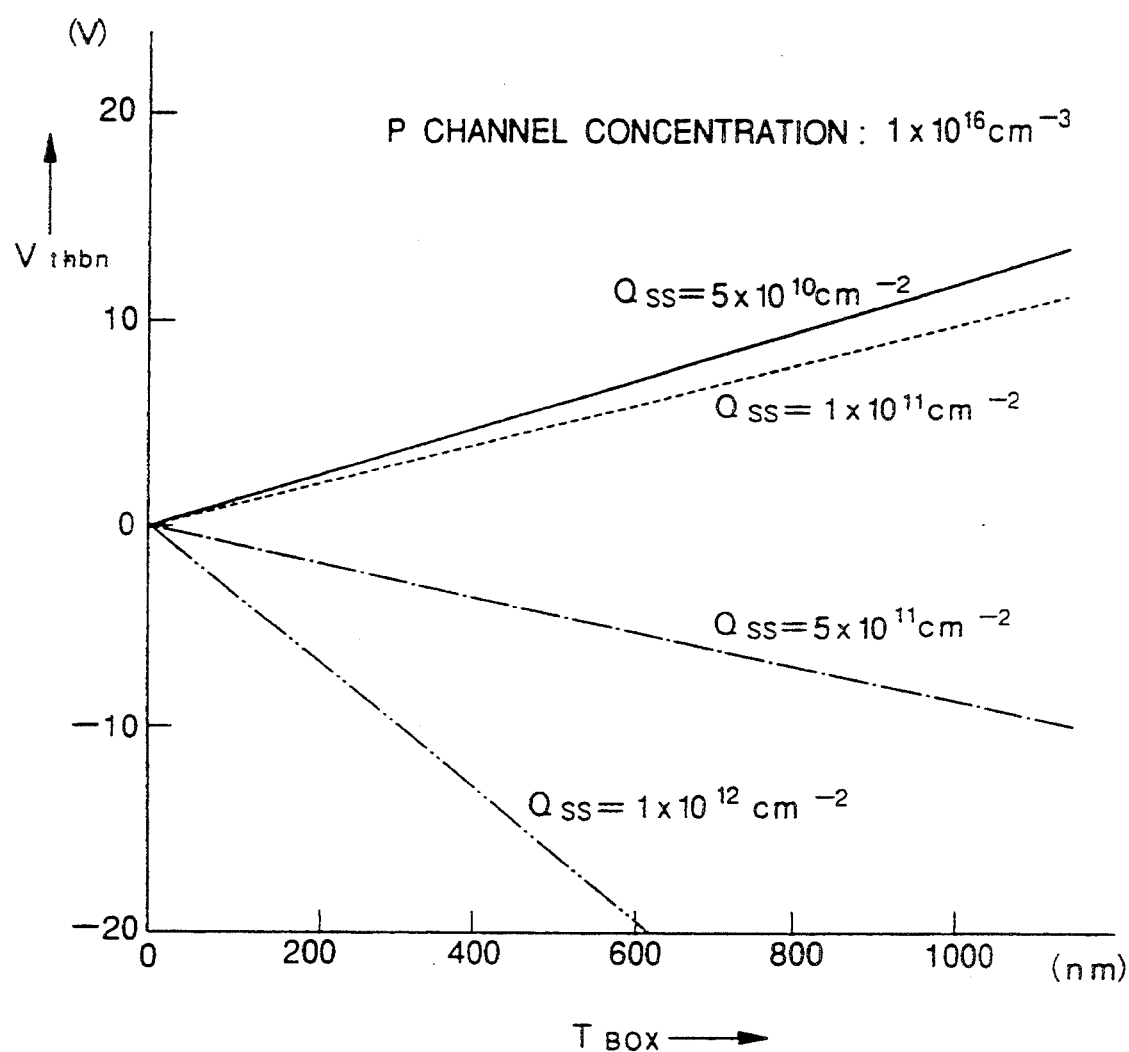
FIG. 3 is a diagram of film thickness-threshold value characteristics of a parasitic NMOS transistor.

FIG. 3 shows film thickness ($T_{BOX}$)—threshold value ($V_{thbn}$) characteristics of a parasitic NMOS transistor with $Q_{SS}$ (fixed positive charge on the base insulation layer) (cm$^{-2}$) used as a parameter. The density in the channel region was set to $1 \times 10^{16}$ cm$^{-3}$.

Figure 4:
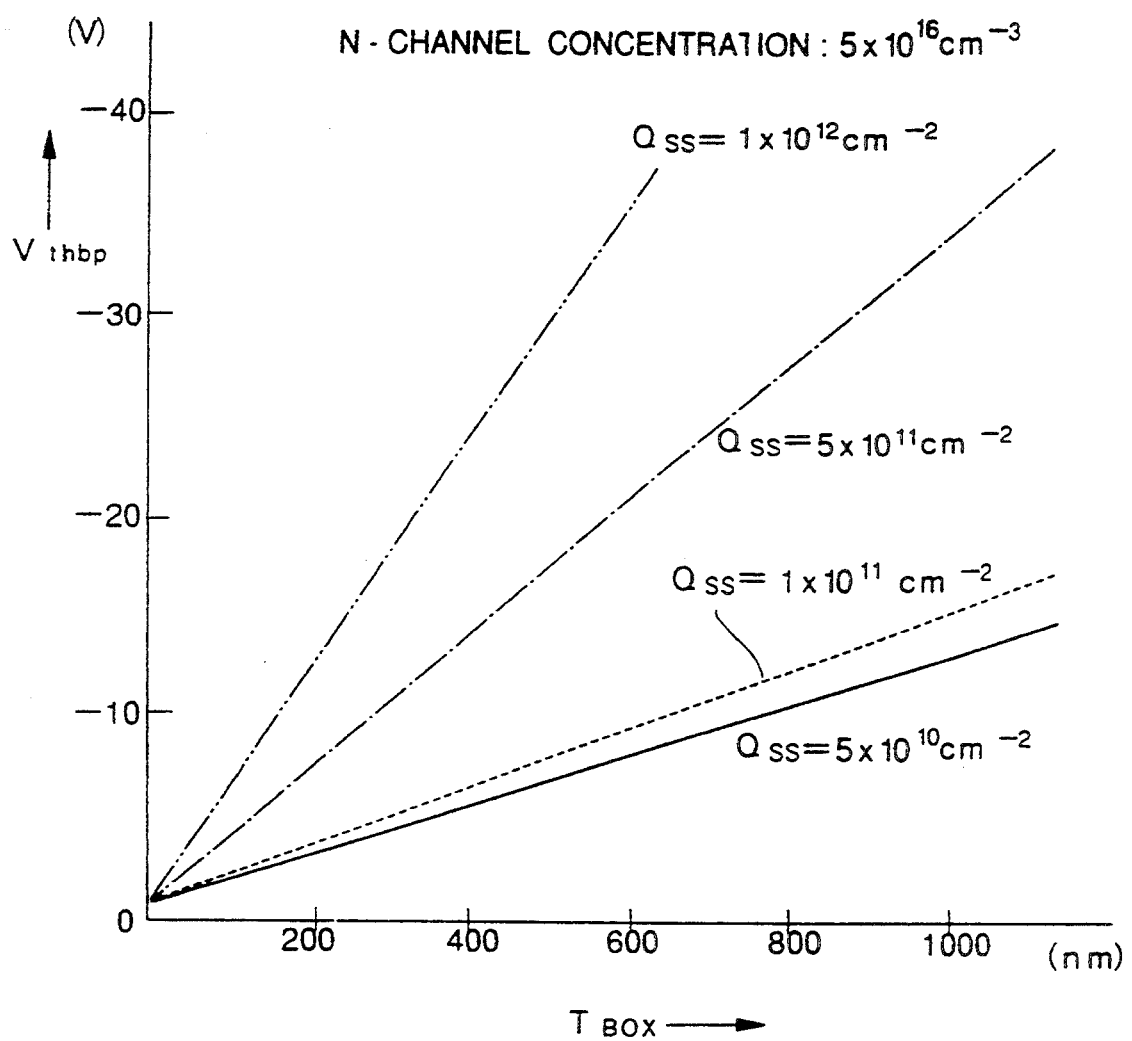
FIG. 4 is a diagram of film thickness-threshold value characteristics of a parasitic PMOS transistor.

FIG. 4 shows film thickness-threshold value ($V_{thbp}$) characteristics of a parasitic PMOS transistor with $Q_{SS}$ used as a parameter. The density in the channel region was set to $5 \times 10^{15}$ cm$^{-3}$ and this indicates parasitic CMOS shut-off current/voltage margin.

Figure 5:
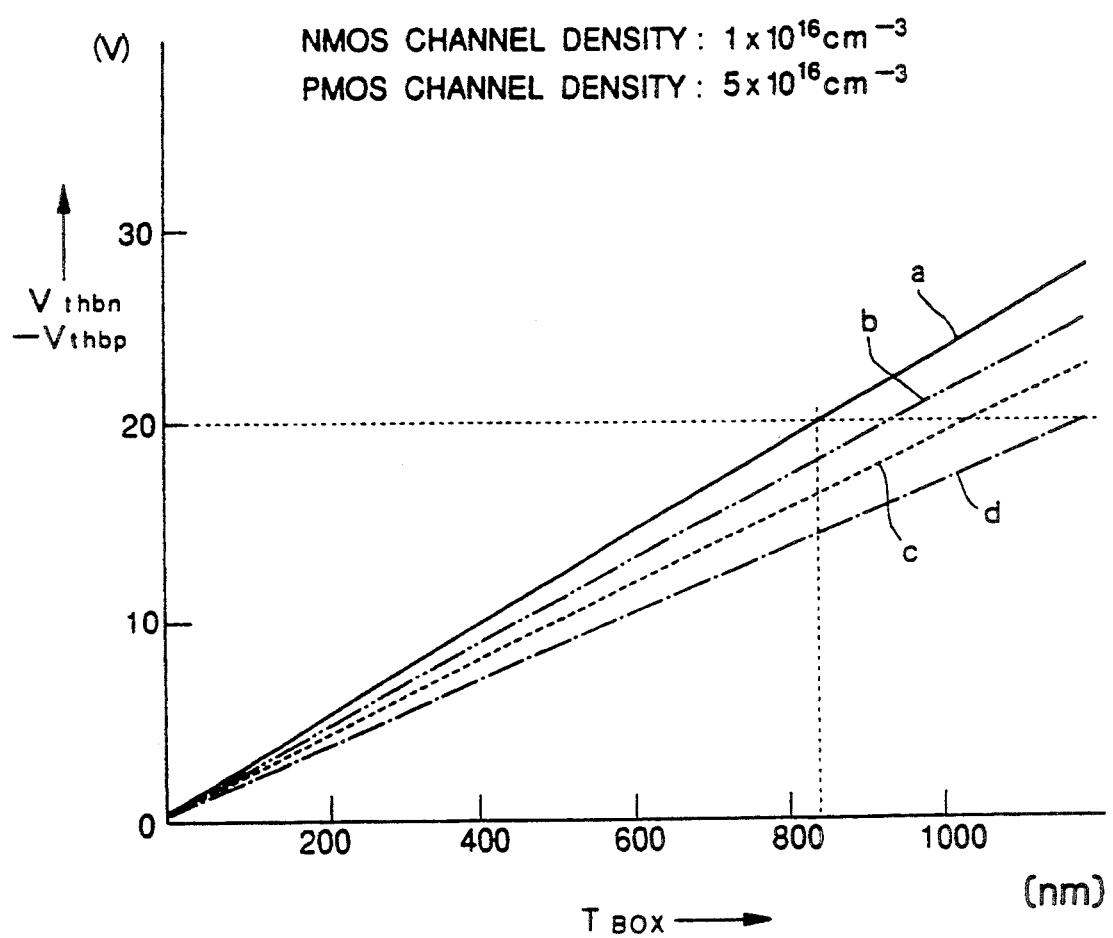
FIG. 5 is a diagram of a relationship between the threshold value and the film thickness of the parasitic MOS transistors.

FIG. 5 shows a relationship between the film thickness and the threshold value difference $V_{thbn} - V_{thbp}$ between the two transistors on the basis of the data shown in FIGS. 3 and 4 with respect to the channel densities of $1 \times 10^{16}$ cm$^{-3}$ and $5 \times 10^{15}$ cm$^{-3}$ and this indicates parasitic CMOS shut-off current/voltage margin.

Figure 1B:
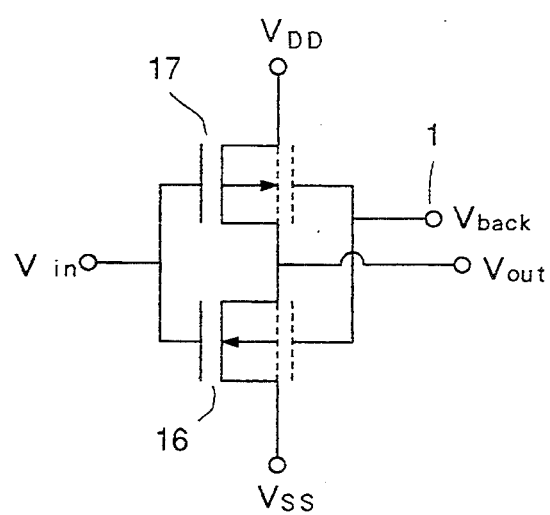

As described above, for the existence of a value of $V_{back}$ with which the parasitic NMOS and PMOS transistors cannot operate, at least $V_{DD} - V_{SS} < V_{thbn} - V_{thbp}$ must be satisfied. The graph of FIG. 5 is formed by using, as a parameter, allowable values of currents flowing in gate voltage ranges below the threshold values. Specifically, curves a, b, c and d correspond to allowable currents of 1 $\mu$A, 10 nA, 100 pA and 1 pA, respectively. In FIG. 1, the relationship between $V_{thbn} - V_{thbp}$ and $T_{BOX}$ is shown with respect to a current of 1 $\mu$A flowing when $V_{back} = V_{thbn}$, $V_{thbp}$, a current down by a factor of 10$^2$ therefrom (allowable current = 10 nA), a current down by a factor of 10$^4$ (allowable current = 100 pA), and a current down by a factor of 10$^6$ (allowable current = pA). There is no influence of $Q_{SS}$ upon the relationship shown in this graph.

In this embodiment, a base insulation layer thickness $T_{BOX} = 10,000$ Å was determined from FIG. 5 under conditions: $V_{DD} - V_{SS} = 14$ V, an allowable current of 100 pA, and a margin of 5 V between the threshold value difference and $V_{DD} - V_{SS}$.

Figure 2:
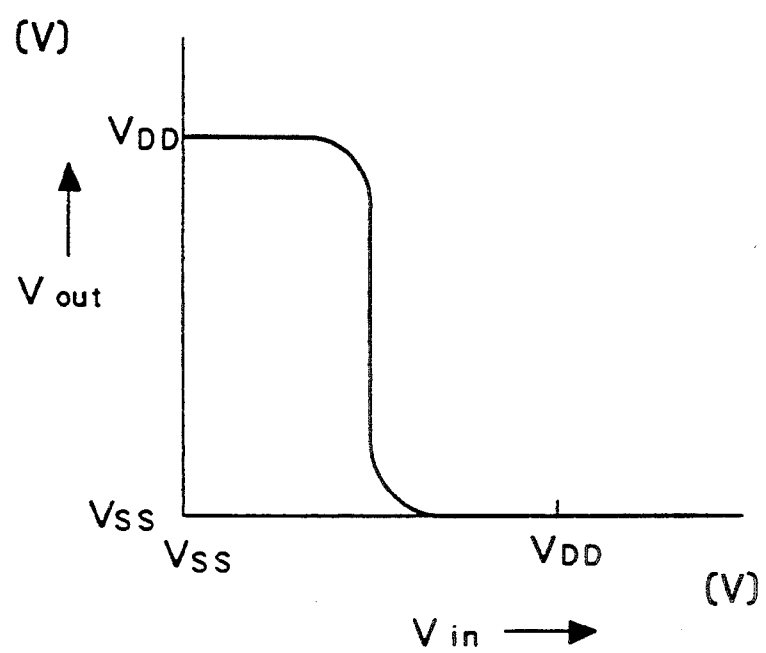
FIG. 2 is a diagram of an input-output characteristic of a CMOS inverter in accordance with a first embodiment of the present invention.

FIG. 2 shows an input-output characteristic of this CMOS inverter. Input-output values closer to an ideal characteristic were exhibited with respect to $V_{DD} = 8$ V, $V_{SS} = -6$ V, and $V_{back} = 3$ V. This CMOS inverter can be used in a driving circuit having a high power supply voltage, 14 V.

EMBODIMENT 2

A semiconductor device was manufactured in the same manner as Embodiment 1 except that a base insulation layer was formed so as to have a three-layer structure formed of 8,000 Å thick layer of SiO$_2$, a 500 Å thick layer of SiN, and a 1,000 Å thick layer of SiO$_2$. The thickness of this three-layer film corresponds to about 9,250 Å in terms of the thickness of the SiO$_2$ single layer structure as determined by conversion with respect to the dielectric constant. In this embodiment, SiN was deposited by a low pressure CVD method. Alternatively, SiN may be formed by being nitrized by rapid thermal annealing at 1,000° C. after SiO$_2$ deposition.

In a case where there is a need to partially remove the Si substrate by etching on the back side thereof, for example, for the purpose of forming a transparent portion such as that of a display portion of a liquid crystal display, etching can easily be stopped since the SiN layer acts as a suitable stopper, and cutting-out can be performed by uniform back-side etching.

The operation at $V_{DD} - V_{SS} = 14$ V was substantially possible, although the threshold values of the parasitic MOS transistors were slightly reduced in comparison with Embodiment 1.

EMBODIMENT 3

Conventionally, a SIMOX substrate is manufactured by a method of injecting, ordinarily, 3 to 5 separated shots of an amount of oxygen ions of $4 \times 10^{17}$ to $2.4 \times 10^{18}$ cm$^{-2}$ with acceleration energy of 150 to 300 keV, and thereafter performing a heat treatment at 1,100° to 1,250° C. for 2 to 20 hours.

In this embodiment, oxygen ions were injected by double-charging using a charge twice as large as the ordinary charge, while an average ion injection range (ion injection depth) Rp = 8,000 Å and a dispersion of ion injection range ΔRp = 4,000 Å were set. SiO$_2$ film having a thickness of 10,000 Å was thereby formed. A CMOS inverter similar to that in accordance with Embodiment 1 was manufactured by using this SIMOX substrate. The CMOS inverter obtained had no leak and had an improved characteristic.

EMBODIMENT 4

Figure 6A:
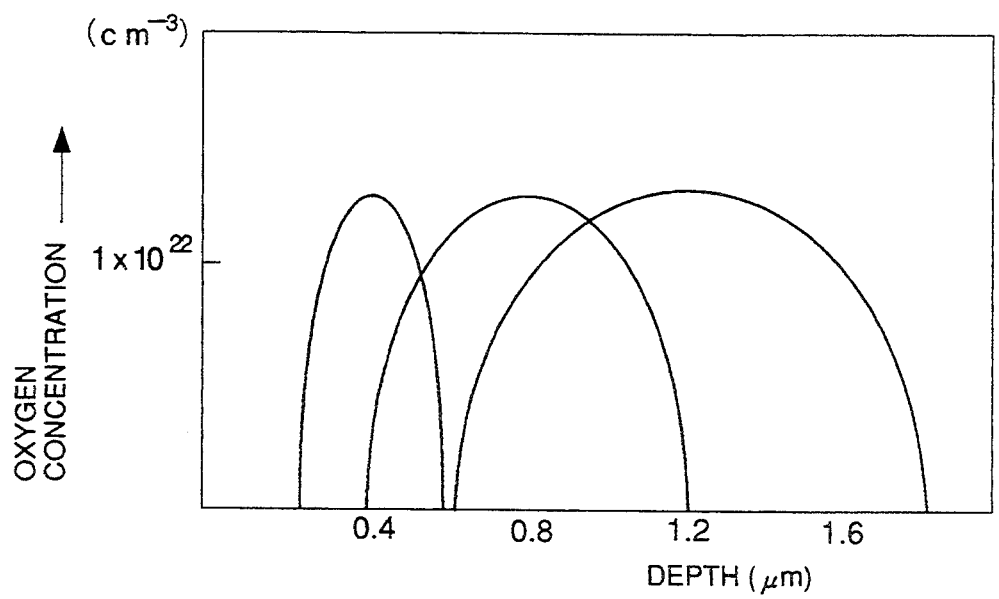
FIG. 6 (a) is a diagram of a SIMOX process practiced in accordance with a fourth embodiment of the present invention.
Figure 6B:
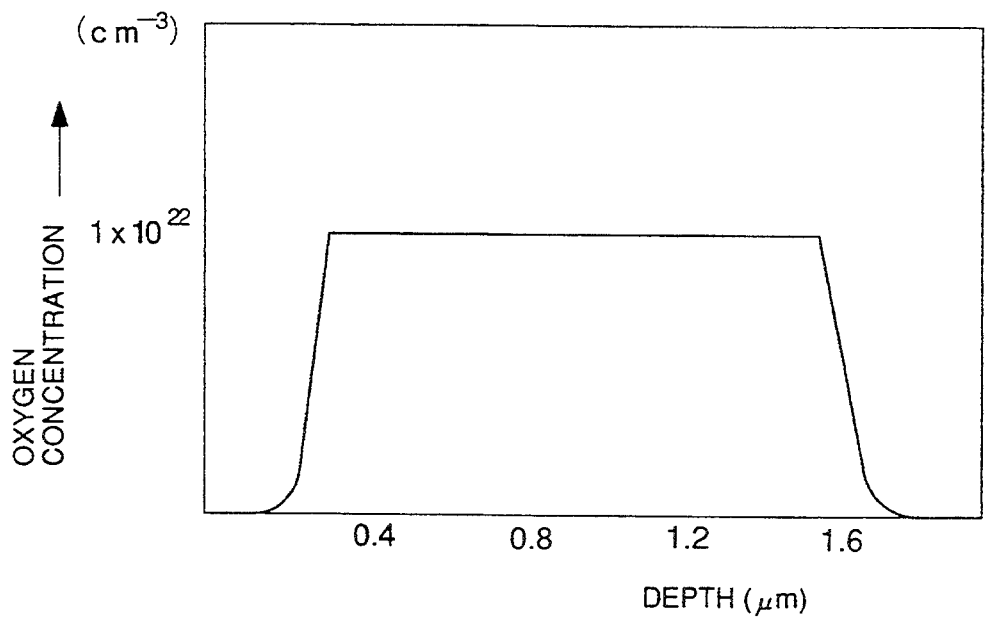

A SIMOX substrate was manufactured by changing energy for oxygen ion injection by three steps as shown in FIG. 6 (a). That is, oxygen ions were injected under conditions: $R_p=150, 250, 400$ keV, and ion injection dose=$5\times10^{17}$, $2\times10^{18}$, $4\times10^{18}$ cm$^{-2}$, followed by a heat treatment at 1,200° C. for 36 hours. With an oxygen profile such as that shown in FIG. 6 (b), SOI (silicon on insulator) on SiO$_2$ film having a thickness of about 1.3 μm was realized. A 20 V driving circuit can be made by forming a CMOS inverter on this SIMOX substrate.

EMBODIMENT 5

Figure 7A:
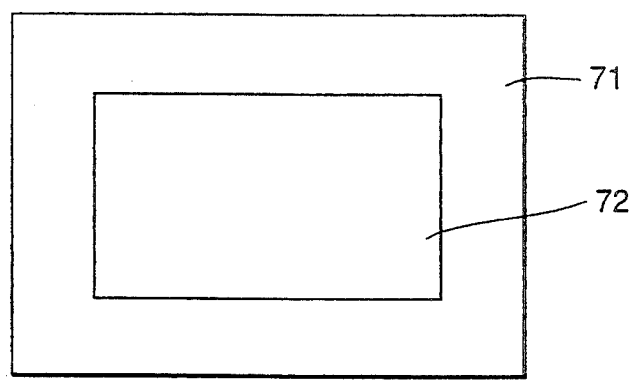
FIGS. 7 (a) and 7 (b) are the illustration of a fifth embodiment of the present invention.
Figure 7B:
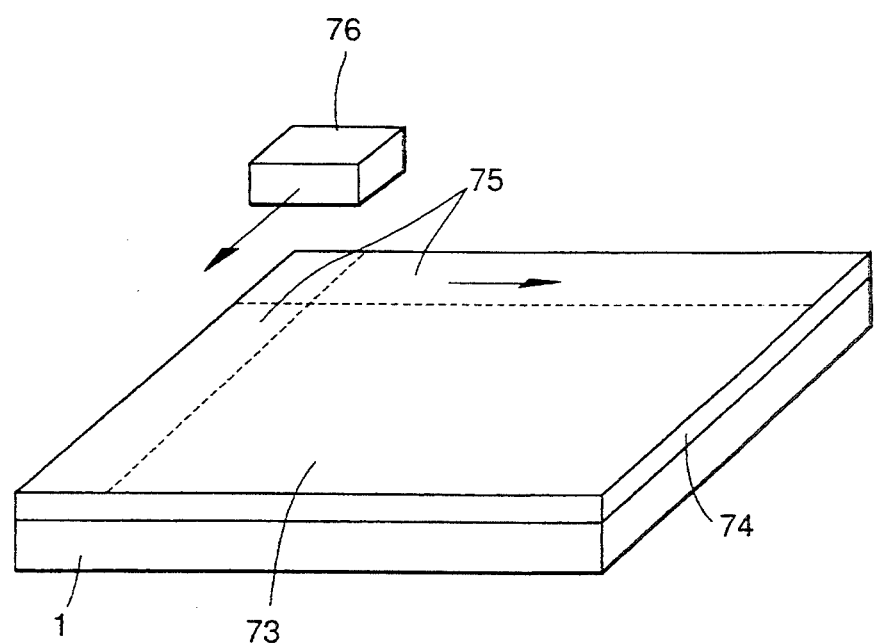

An active matrix type of liquid crystal display having a semiconductor device in accordance with the present invention was manufactured by forming a polycrystalline or amorphous Si layer on a transparent substrate and by processing a necessary portion thereof by laser annealing so that the processed portion is changed into a monocrystal. FIG. 7 (a) is a plan view of this display. A display portion 72 is formed at the center of the substrate and is surrounded by a drive circuit portion 71. Chips integrated in an active matrix and a circuit for driving the matrix are provided on a device region 74 formed in an amorphous region 73. A laser light source used for laser annealing is of a high output (5 to 1,000 mW) type using a helium neon lamp as a light source. In the display in accordance with this embodiment, only the drive circuit is required to have a high-speed switching operation. Therefore, only the drive circuit portion is scanned with the laser light source, as illustrated. The scanned portion is changed into a monocrystal region where the carrier mobility is the same as that in ordinary monocrystal Si, thereby enabling high-speed driving. The manufacturing cost is increased by the laser annealing process. However, the increase in the manufacturing cost is limited by setting a necessary minimum processed region as described above. It is thereby possible to manufacture a high-integration high-resolution liquid crystal display having two hundred thousand or more pixels.

EMBODIMENT 6

Figure 8:
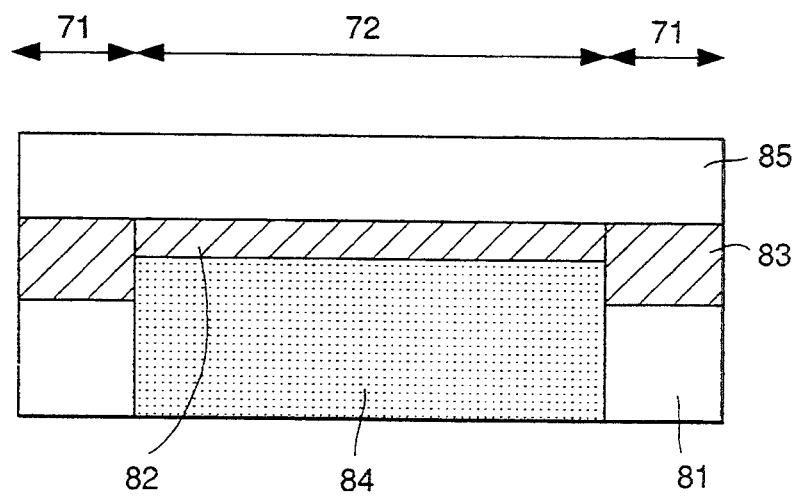
FIG. 8 is a cross-sectional view of a sixth embodiment of the present invention.
Figure 9:
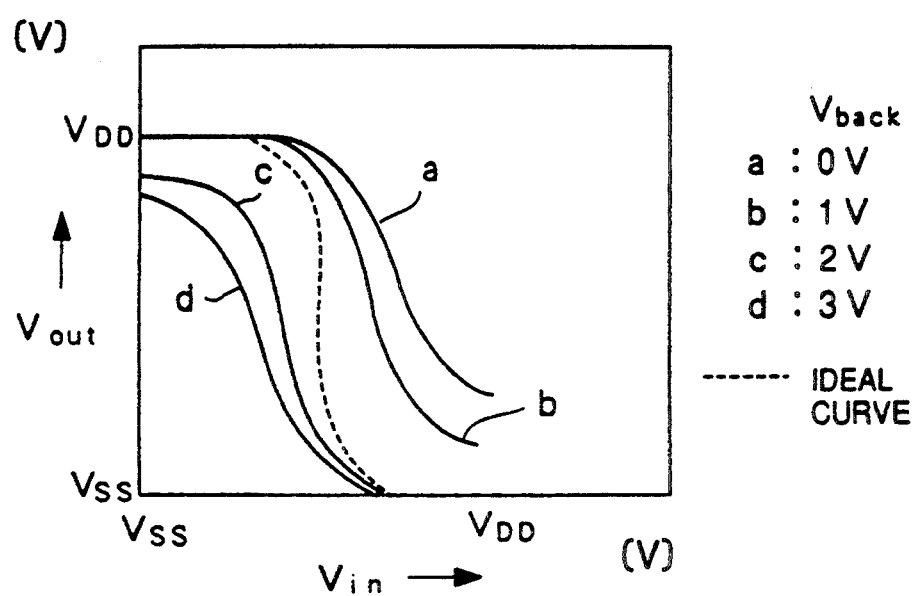
FIG. 9 is a diagram of input-output characteristics of a conventional CMOS inverter.

FIG. 8 shows an example of a preferred form of the liquid crystal display in accordance with the present invention. In this embodiment, a drive circuit portion 71 is formed on a thick SiO$_2$ film 83 (having a thickness of 10,000 Å, for example), enabling driving of $V_{DD}-V_{SS}=14$ V. A display portion 72 in which transistors serving as switching devices for applying voltages to liquid crystal cells are arranged in the form of a matrix is formed on a thin SiO$_2$ film 82. A monocrystal Si substrate 81 at the back side of the display portion 72 is partially removed by wet etching, and a space thereby formed is filled with a back packing (silicone rubber) 84 for reinforcement. This packing is almost transparent and allows back light from under to pass in order to efficiently illuminate the display portion.

Only PMOS transistors are used as switching devices in the display portion. The back packing 84 has an insulating property. Therefore, even if there are movable ions (ordinarily, positive ions) in the back packing, the parasitic PMOS transistor does not operate by this charge.

Thus, an unnecessary increase in the SiO$_2$ film is limited to reduce stresses remaining in the SiO$_2$ film and the device region after cutting-out of the monocrystal silicon substrate. It is thereby possible to avoid an arrangement of liquid crystal cells on the outer device region and to improve image qualities.

As described above, in the semiconductor device in accordance with the present invention, a leak current, relating to the problem of the conventional art, can be prevented by controlling the film thickness of the base insulation layer. The semiconductor device can there perform high speed driving with a high power supply voltage. The liquid crystal display of the present invention using the semiconductor device in a drive circuit can be designed for high-resolution high-image-quality image display.

While the present invention has been described with respect to what presently are considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor device comprising an insulation layer, a thin-film Si layer formed on said insulation layer and having at least one monocrystal Si region formed therein, and an NMOS transistor and a PMOS transistor formed on said at least one monocrystal Si region, wherein a thickness $T_{BOX}$ of said insulation layer at a point where said NMOS and PMOS transistors are formed, a voltage $V_{SS}$ of a first power supply and a voltage $V_{DD}$ of a second power supply to be connected to said NMOS and PMOS transistors, respectively, satisfy a relationship expressed by the following inequality:

$$T_{BOX}>(V_{DD}-V_{SS}K_2)/K_1$$

where $V_{DD}>V_{SS}$, $K_1\equiv\epsilon_{BOX}^{-1}(Q_{BN}+Q_{BP})$, $K_2\equiv 2\Phi_{FN}+2\Phi_{FP}-1.03$, $\epsilon_{BOX}$ is a dielectric constant of said base insulation layer, $Q_{BN}$ and $Q_{BP}$ are respective bulk charges of said NMOS and PMOS transistors when widths of depletion layers of said NMOS and PMOS transistors are maximized, and $\Phi_{FN}$ and $\Phi_{FP}$ are pseudo-Fermi potentials of said NMOS and PMOS transistors, respectively.

2. A liquid crystal display, in which a PMOS switching transistor is used as a pixel electrode switching device, comprising a peripheral drive circuit including a semiconductor device, said semiconductor device including an insulation layer, a thin-film Si layer formed on said insulation layer with at least one monocrystal Si region formed therein, and a CMOS inverter including an NMOS transistor and a PMOS transistor formed on said at least one monocrystal Si region, wherein a thickness $T_{BOX}$ of said insulation layer at a point where said NMOS and PMOS transistors are formed, a voltage $V_{SS}$ of a first power supply and a voltage $V_{DD}$ of a second power supply to be connected to said NMOS and PMOS transistors, respectively, satisfy a relationship expressed by the following inequality:

$$T_{BOX}>(V_{DD}-V_{SS}-K_2)/K_1$$

where $V_{DD}>V_{SS}$, $K_1\equiv\epsilon_{BOX}^{-1}(Q_{BN}+Q_{BP})$, $K_2\equiv 2\Phi_{FN}+2\Phi_{FP}-1.03$, $\epsilon_{BOX}$ is a dielectric constant of said base insulation layer, $Q_{BN}$ and $Q_{BP}$ are bulk charges when widths of depletion layers of said NMOS and PMOS transistors are maximized, and $\Phi_{FN}$ and $\Phi_{FP}$ are pseudo-Fermi potentials of said NMOS and PMOS transistors, and wherein said PMOS switching transistor is formed on a display portion of said insulation layer and said CMOS inverter is formed on a drive circuit portion of said insulation layer, a thickness of said display portion being less than a thickness of said drive circuit portion.

3. A semiconductor device according to claim 1 or 2, wherein said monocrystal Si region comprises a thin film obtained by epitaxial growth on a porous Si substrate member.

4. A semiconductor device according to claim 1 or 2, wherein said monocrystal Si region comprises a thin film formed by separation by implanted oxygen.

5. A semiconductor device according to claim 1 or 2, wherein said monocrystal Si region comprises a thin film formed by recrystallizing a polycrystalline or amorphous Si thin film by laser annealing.

6. A semiconductor device according to claim 1 or claim 2, wherein a leakage current through said NMOS transistor and said PMOS transistor is less than 100 pA for every 1 µm of gate length.

7. A semiconductor device according to claim 1 or claim 2, wherein a crystal Si substrate is disposed underneath said insulation layer.

8. A semiconductor device according to claim 1 or claim 2, wherein the value of $V_{DD}-V_{SS}$ is greater than 10 V.

* * * * *